(12) United States Patent
Isaac et al.

(10) Patent No.: US 7,558,543 B2
(45) Date of Patent: Jul. 7, 2009

(54) RADIO FREQUENCY TUNER

(75) Inventors: Ali Isaac, Bristol (GB); Nicholas Paul Cowley, Wiltshire (GB)

(73) Assignee: Intel Corporation, Santa Clara, CA (US)

( * ) Notice: Subject to any disclaimer, the term of this patent is extended or adjusted under 35 U.S.C. 154(b) by 458 days.

(21) Appl. No.: 11/439,540

(22) Filed: May 24, 2006

(65) Prior Publication Data
US 2006/0281432 A1  Dec. 14, 2006

(30) Foreign Application Priority Data
Jun. 8, 2005   (GB)   ................................. 0511579.5

(51) Int. Cl.
H04B 17/00   (2006.01)
H04B 1/10    (2006.01)

(52) U.S. Cl. ................. 455/130; 455/67.14; 455/226.1; 455/296; 455/305

(58) Field of Classification Search ................ 455/67.1, 455/67.13, 67.14, 208, 214, 226.1–226.3, 455/283–285, 295, 296, 304–305, 336–340; 375/344–346
See application file for complete search history.

(56) References Cited

U.S. PATENT DOCUMENTS

| | | | |
|---|---|---|---|
| 5,757,921 A | 5/1998 | Okanobu et al. | |
| 6,330,290 B1 * | 12/2001 | Glas | ............. 375/324 |
| 6,714,776 B1 | 3/2004 | Birleson | |
| 7,020,220 B2 * | 3/2006 | Hansen | ............ 375/324 |
| 7,095,454 B2 * | 8/2006 | Waight et al. | ............ 348/731 |
| 7,423,699 B2 * | 9/2008 | Vorenkamp et al. | ......... 348/726 |
| 2003/0003891 A1 | 1/2003 | Kivekas et al. | |
| 2003/0017817 A1 * | 1/2003 | Cowley | ............. 455/323 |
| 2003/0174641 A1 * | 9/2003 | Rahman | ............ 370/206 |
| 2004/0184562 A1 * | 9/2004 | Wang et al. | ............. 375/322 |
| 2005/0047536 A1 * | 3/2005 | Wu et al. | ............. 375/346 |
| 2005/0260949 A1 * | 11/2005 | Kiss et al. | ............. 455/67.14 |
| 2006/0068739 A1 * | 3/2006 | Maeda et al. | ............. 455/295 |
| 2006/0083335 A1 * | 4/2006 | Seendripu et al. | ........... 375/332 |

FOREIGN PATENT DOCUMENTS

EP   1 178 604 A1   2/2002

* cited by examiner

*Primary Examiner*—Simon D Nguyen
(74) *Attorney, Agent, or Firm*—Blakely, Sokoloff, Taylor & Zafman LLP

(57) ABSTRACT

A radio frequency tuner includes a first quadrature frequency changer, I and Q filters which are electronically adjustable, and a second quadrature frequency changer. During alignment of the filters, an alignment controller connects a test tone generator to the input of the frequency converter and the generator supplies a sequence of test tones of different accurately known frequencies. The amplitude of the resulting signals at the output of one of the filters is measured by a level detector. The controller compares the measured levels with a desired frequency response and adjusts the filter accordingly. The controller then causes the generator to supply a sequence of two test tones of different frequencies and a differential phase detector measures the phase difference between the output signals of the mixers of the second frequency changer. The controller adjusts the response of the other filter and the test procedure is repeated until phase imbalances between the filters are substantially reduced or eliminated.

9 Claims, 2 Drawing Sheets

RADIO FREQUENCY TUNER

TECHNICAL FIELD

The present invention relates to a radio frequency tuner. Such a tuner may be used, for example, for receiving television (TV) signals, digital audio broadcast (DAB) signals, or data signals from a terrestrial or satellite aerial system or from a cable distribution network.

SUMMARY

According to the invention, there is provided a radio frequency tuner comprising: a frequency changer arrangement comprising a first quadrature frequency changer having first and second mixers for providing in-phase and quadrature signals, electrically adjustable in-phase and quadrature filters for filtering the in-phase and quadrature signals, respectively; and a second quadrature frequency changer having third and fourth mixers for receiving the filtered in-phase and quadrature signals, respectively; a signal generator for generating a test tone of adjustable frequency; an amplitude measuring stage for measuring the signal amplitude downstream of a first of the third and fourth mixers; a differential phase measuring stage for measuring the phase difference between signals downstream of the filters; and a controller arranged, during a first alignment phase, to cause the signal generator to supple one at a time a plurality of tones of different frequencies to the frequency changer arrangement, to record the amplitudes measured by the measuring stage for the tones, and to adjust the first filter based on the recorded amplitudes so as to provide a predetermined frequency response, the controller being arranged, during a second alignment phase, to perform the steps of: (a) causing the signal generator to supply one at a time first and second tones of different frequencies to the frequency changer; (b) forming the difference between the phase differences measured by the differential phase measuring stage for the first and second tones; (c) adjusting the second of the filters; and (d) repeating the steps (a) to (c) until the difference formed in the step (b) meets a predetermined criterion.

The predetermined criterion may be that the absolute value of the difference formed in the step (b) is less than a predetermined threshold.

The first frequency changer may be a downconverter.

The second frequency changer may be an upconverter.

The filters may be of identical structure.

The filters may be low pass filters of electronically adjustable turnover frequency.

The controller may comprise a state machine.

The controller may be arranged to perform the first and second alignment phases at switch-on of the tuner.

The controller may be arranged to perform the first and second alignment phases following each channel selection request.

It is thus possible to provide a tuner in which filters in the in-phase (I) and quadrature (Q) circuit paths of a quadrature frequency converter can be aligned so as to achieve a desired frequency response and so as to remove or substantially reduce phase imbalances between the I and Q circuit paths. Such an alignment procedure may be performed from time to time so as to ensure that the tuner does not drift out of alignment with time, for example as a result of temperature or component ageing effects. Although filter alignment may be performed during manufacture, this is not necessary as the filters may be automatically aligned during use of the tuner.

DETAILED DESCRIPTION

Figure 1:
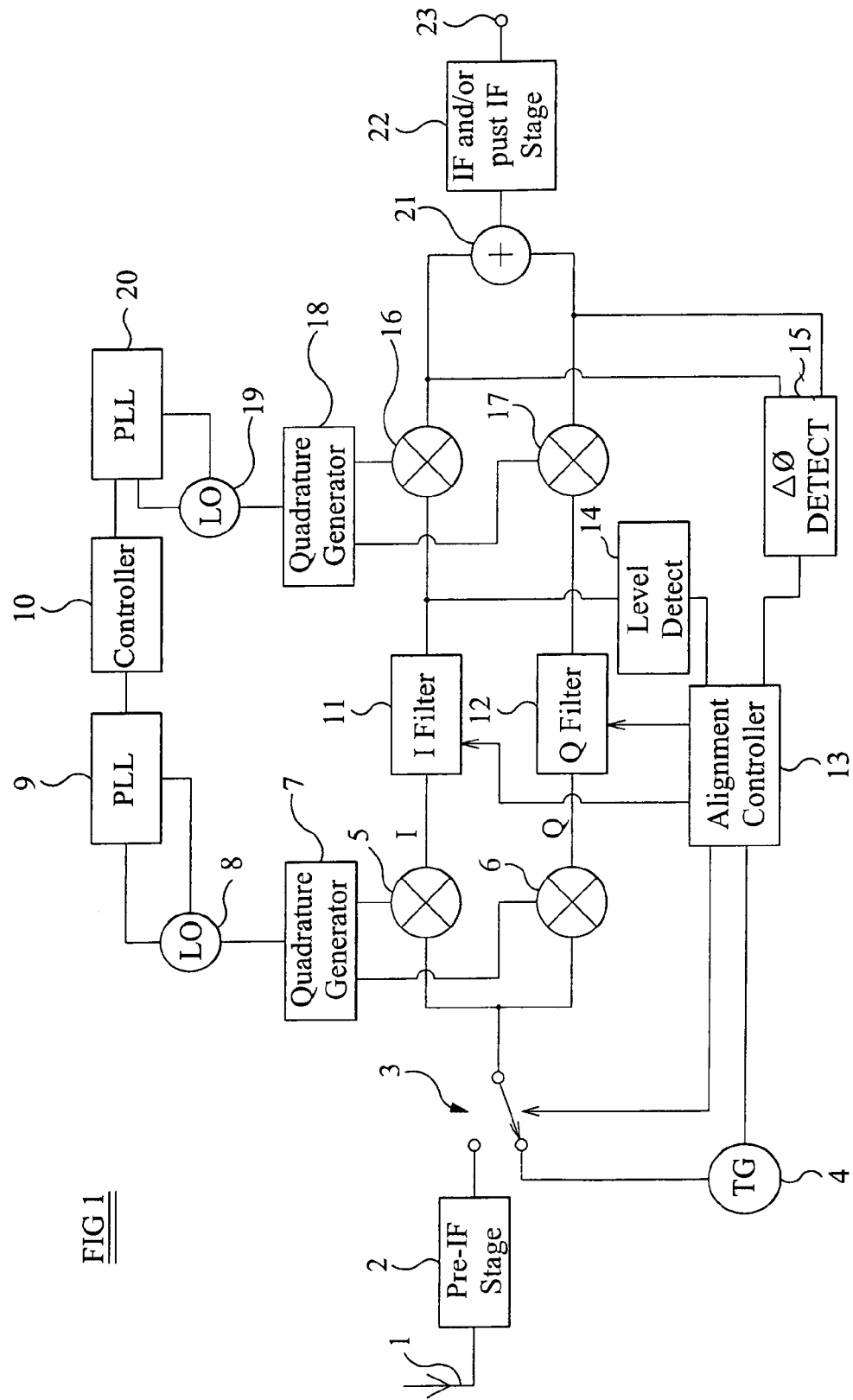
FIG. 1 is a block circuit diagram of a radio frequency tuner constituting an embodiment of the invention.

The tuner shown in FIG. 1 comprises an input 1 for connection to a broadcast signal distribution arrangement, such as a terrestrial aerial, a satellite aerial system or a cable distribution network. The input 1 is connected to the input of a pre-intermediate frequency (IF) stage 2. The structure and purpose of the stage 2 depend on the type and application of the tuner. For example, in the case of a single conversion tuner, the stage 2 may comprise one or more tracking bandpass filters and an automatic gain control arrangement. In the case of a multiple conversion tuner, the stage 2 may comprise a frequency changer of the upconverter type and an automatic gain control arrangement.

The output of the stage 2 is connected to a first input of an electronic changeover switch 3, whose second input is connected to the output of a test tone generator (TG) 4. The output of the switch 3 is connected to the signal inputs of I and Q mixers 5 and 6 forming part of a quadrature frequency changer of upconverter type. The mixers 5 and 6 have commutating signal inputs connected to the outputs of a quadrature signal generator 7 arranged to provide commutating signals which are in phase-quadrature with respect to each other. The generator 7 derives the commutating signals from the output of a local oscillator (LO) 8 controlled by a phase locked loop (PLL) synthesiser 9. The synthesiser 9 is controlled by a controller 10 for controlling operation of the tuner. For example, the controller 10 receives user requests for reception of a desired channel in a multiple-channel input signal supplied to the input 1 and controls the synthesiser 9 so as to supply commutating signals of the appropriate frequency to the mixers 5 and 6.

The I and Q signals from the mixers 5 and 6 are supplied to I and Q filters 11 and 12, respectively. The frequency responses of the filters 11 and 12 are electronically controllable by means of signals supplied by an alignment controller 13, which may comprise a state machine and which is shown as being separate from the controller 10 but which may be incorporated in the controller 10.

The alignment controller 13 has an output for controlling switching of the electronic switch 3. The alignment controller 13 also has an output which controls operation of the test tone generator 4. In particular, the alignment controller 13 is arranged to enable and disable the generator 4 and to set the frequency of its output signal. A level detector 14 measures the signal amplitude at the output of one of the filters (the I filter 11 in the illustrated embodiment) and supplies a signal representative of signal amplitude to another input of the controller 13.

The outputs of the I and Q filters 11 and 12 are connected to the inputs of mixers 16 and 17, respectively, which form a quadrature frequency changer of the downconverter type. The mixers 16 and 17 have commutating signal inputs connected to the outputs of a quadrature signal generator 18 arranged to provide commutating signals which are in phase-quadrature with respect to each other. The generator 18 derives the commutating signals from the output of a local oscillator 19 controlled by a phase locked loop synthesiser 20. The synthesiser 20 is controlled by the controller 10. A differential phase ($\Delta\Phi$) detector 15 has inputs connected to the outputs of the mixers 16 and 17 and supplies a signal representative of the phase difference between the mixer output signals to the controller 13.

The outputs of the mixers 16 and 17 are connected to a summer 21, whose output is connected to an IF and/or post IF stage 22. The stage 22 may, for example, include channel filtering and a further automatic gain control arrangement. The output of the stage 22 is supplied to an output 23 of the tuner, for example for connection to an appropriate demodulator.

Each time the tuner is switched on or "powered up", the alignment controller 13 causes the tuner to perform consecutive first and second alignment phases for aligning the filters 11 and 12. During both alignment phases, the controller 13 controls the switch 3 to connect the inputs of the mixers 5 and 6 to the output of the test tone generator 4. The controller 13 enables the generator 4 and selects the appropriate test tone frequencies.

During the first alignment phase, the controller 13 causes the generator 4 to produce a sequence of test tones at different accurately known frequencies. The signal amplitude at the output of the filter 11 for each frequency is measured by the level detector 14 and recorded or stored in the controller 13. When the sequence of test tones has been completed, the controller analyses the recorded amplitude measurements so as to determine an appropriate adjustment for the frequency response of the filter 11. For example, the nature of the filter 11 is known and it may therefore be possible for the controller to adjust its frequency response in a single step so as to achieve the desired frequency response. Where the filter 11 is a low pass filter, this may simply involve setting the turnover or cut-off frequency of the filter to a desired value.

Alternatively, the frequency response of the filter 11 may be adjusted iteratively. In particular, an adjustment to the response may be made by the controller 13 and the test procedure repeated until the desired frequency response is achieved with sufficient or acceptable precision.

During the first alignment phase, the filter 12 need not be adjusted. However, it is also possible for both filters to be adjusted simultaneously based on the amplitude measurements at the output of the filter 11.

When the frequency response of the filter 11 has been aligned, its response is effectively fixed by the controller and the second alignment phase is then performed. During this phase, the controller 13 causes the generator 4 to generate consecutively a plurality of test tones of different frequencies. In practice, it is sufficient to generate two test tones of different frequencies. Further, the actual frequencies need not be accurately defined but should be sufficiently far apart within the passband of the filters 11 and 12 to provide reliable measurements.

The detector 15 detects the difference between the phases of the output signals of the mixers 16 and 17 for each test tone frequency and the controller 13 forms the difference between these two measured phase differences. When the filters 11 and 12 are misaligned, the measured phase differences are a function of frequency so that the difference between the measured phase differences is non-zero. When the filters 11 and 12 are aligned, the measured phase difference is substantially constant for all frequencies in the filter passbands so that the difference between the measured phase differences is substantially zero. In practice, the difference between the measured phase differences at different frequencies may not be exactly zero when the filters are correctly aligned so the alignment criterion may be that the absolute value of the difference is less than a suitable threshold.

The controller 13 adjusts the filter 12 so as to attempt to reduce the difference between the measured phase differences in order to improve alignment between the filters 11 and 12. The test cycle is then repeated until the alignment criterion is met so that the filters 11 and 12 are substantially aligned. The characteristics of the filter 12, such as the turnover frequency, are then fixed.

An alternative or additional alignment criterion is that the polarity of the difference between measured phase differences changes from one test cycle to the next.

When the first and second alignment phases have been completed, the controller disables the generator 4 and causes the switch to disconnect the mixers 5 and 6 from the generator and to connect them to the output of the stage 2. The tuner is then ready for reception of desired channels.

The alignment procedure may be performed only upon switch-on of the tuner or may be performed from time to time during operation of the tuner. For example, the alignment procedure may be performed each time a user requests selection of a channel or a different channel for reception. Between consecutive alignment procedures, the frequency responses of the filters 11 and 12 are held fixed by the alignment controller 13.

Figure 2:
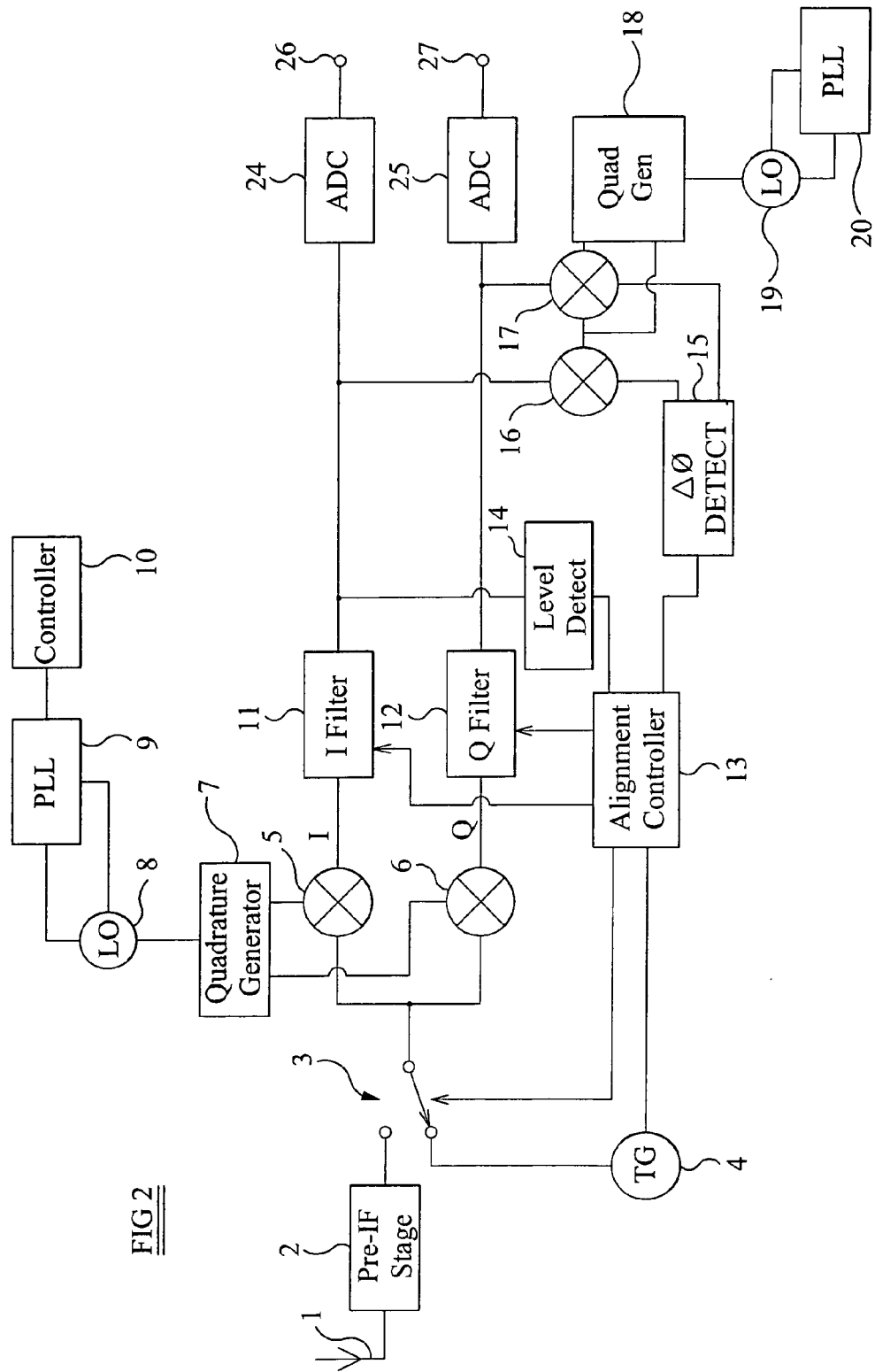
FIG. 2 is a block circuit diagram of a radio frequency tuner constituting another embodiment of the invention.

The tuner shown in FIG. 2 differs from that shown in FIG. 1 in that the summer 21 and the stage 22 are omitted and output signals are taken from the outputs of the filters 11 and 12. Thus, the mixers 16 and 17 are not in the direct signal path of the tuner but are connected between the I and Q signal paths and the inputs of the detector 15. The outputs of the filters 11 and 12 are, in this example, shown as being connected to analog/digital converters (ADCs) 24 and 25, whose outputs are connected to I and Q outputs 26 and 27 for providing I and Q signals in the digital domain for further processing.

The tuner may perform the alignment procedure during manufacture in order to ensure that the filters are initially aligned so that further alignment procedures may be performed relatively quickly. However, this is not necessary. Thus, if more convenient, the first alignment procedure may be performed when the tuner is first switched on by a user. Each subsequent alignment procedure starts with the previous frequency response settings of the filters 11 and 12, which are stored in non-volatile memory within the controller 13, so that each subsequent alignment procedure may be completely relatively quickly and without presenting any perceivable artefacts to the user.

The invention claimed is:

1. A radio frequency tuner comprising: a frequency converter arrangement comprising a first quadrature frequency converter having first and second mixers for providing in-phase and quadrature signals, electronically adjustable in-phase and quadrature filters for filtering said in-phase and quadrature signals, respectively, and a second quadrature frequency converter having third and fourth mixers for receiving said filtered in-phase and quadrature signals, respectively; a signal generator for generating a test tone of an adjustable frequency; an amplitude measuring stage for measuring a signal amplitude downstream of said third and fourth mixers; a differential phase measuring stage for measuring a phase difference between signals downstream of said third and fourth mixers; and a controller arranged, during a first alignment phase, to cause said signal generator to supply one at a time a plurality of tones of different frequencies to said frequency converter arrangement, to record amplitudes measured by said measuring stage for said tones, and to adjust a first of said quadrature filters based on said recorded amplitudes so as to provide a predetermined frequency response, said controller being arranged, during a second alignment phase, to perform the steps of: (a) causing said signal generator to supply one at a time first and second tones of different frequencies to said frequency converter; (b) forming a difference between phase differences measured by said differential phase measuring stage for said first and second tones; (c) adjusting a second of said quadrature filters; and (d) repeating said steps (a) to (c) until said difference formed in said step (b) meets a predetermined criterion.

2. A tuner as claimed in claim 1, in which said predetermined criterion is that an absolute value of said difference formed in said step (b) is less than a predetermined threshold.

3. A tuner as claimed in claim 1, in which said first frequency converter is a downconverter.

4. A tuner as claimed in claim 1, in which said second frequency converter is an upconverter.

5. A tuner as claimed in claim 1, in which said filters are of an identical structure.

6. A tuner as claimed in claim 1, in which said filters are low pass filters of electronically adjustable turnover frequencies.

7. A tuner as claimed in claim 1, in which said controller comprises a state machine.

8. A tuner as claimed in claim 1, in which said controller is arranged to perform said first and second alignment phases at a switch-on of said tuner.

9. A tuner as claimed in claim 1, in which said controller is arranged to perform said first and second alignment phases following each channel selection request.

* * * * *